United States Patent [19]

Cicerone

[11] Patent Number: 4,870,347
[45] Date of Patent: Sep. 26, 1989

[54] UNIVERSAL MASTER BREAKOUT UNIT FOR TESTING AVIONIC SYSTEMS

[76] Inventor: Arnold Cicerone, 4780 Elder Ave., Seal Beach, Calif. 90740

[21] Appl. No.: 158,399

[22] Filed: Feb. 22, 1988

[51] Int. Cl.$^4$ .................. G01R 1/04; G01R 31/00
[52] U.S. Cl. .................. 324/73 R; 324/158 F; 324/158 R
[58] Field of Search .......... 324/73 R, 73 AT, 73 PC, 324/158 F, 158 R, 510, 511, 407, 408; 539/52, 53

[56] References Cited

U.S. PATENT DOCUMENTS

| | | | |
|---|---|---|---|
| 2,217,925 | 10/1940 | Triplett | 324/407 |
| 2,962,659 | 11/1960 | Neill | 324/73 R |
| 3,411,072 | 11/1968 | Catelli | 324/408 |
| 3,646,438 | 2/1972 | Staff | 324/73 R |
| 3,783,378 | 1/1974 | Mildner | 324/73 R |
| 3,890,836 | 6/1975 | McKenzie et al. | 324/73 R |
| 4,251,765 | 2/1981 | Mears | 324/73 R |
| 4,262,248 | 4/1981 | Vincelli et al. | 324/73 R |
| 4,493,951 | 1/1985 | Sanderson et al. | 324/158 F |

*Primary Examiner*—Reinhard J. Eisenzopf
*Assistant Examiner*—W. Burns
*Attorney, Agent, or Firm*—Beehler, Pavitt, Siegemund, Jagger, Martella & Dawes

[57] ABSTRACT

A universal breakout unit is provided whereby aircraft circuits or systems may be accessed and tested regardless of the design differences between the various aircraft systems. The universal breakout unit comprises an array of associated pairs of input and output jacks which are disposed on a face panel of the breakout unit. Each input jack of each associated pair is uniformly wired to a connection with one or more input connectors. Similarly, each one of the output jacks of the associated pairs is wired to one connection within one or more output connectors. The input and output jacks are selectively coupled to each other through a manual toggle switch. A specially wired harness, corresponding to each specific aircraft circuit, is provided for connection to the input connector or output connector. A template which is designed to fit the face plate of the breakout unit and the array of associated pairs of jacks which corresponds to the selected harnesses and the selected aircraft circuit can then be placed on the face plate of the master breakout unit. Labels on the template designate what signal or test point will then appear across the proximate pair of jacks. The signal may be tested through the use of patch cords coupling meters which may be included within the master breakout unit or may be coupled to meters or other test devices separate from the breakout unit.

9 Claims, 3 Drawing Sheets

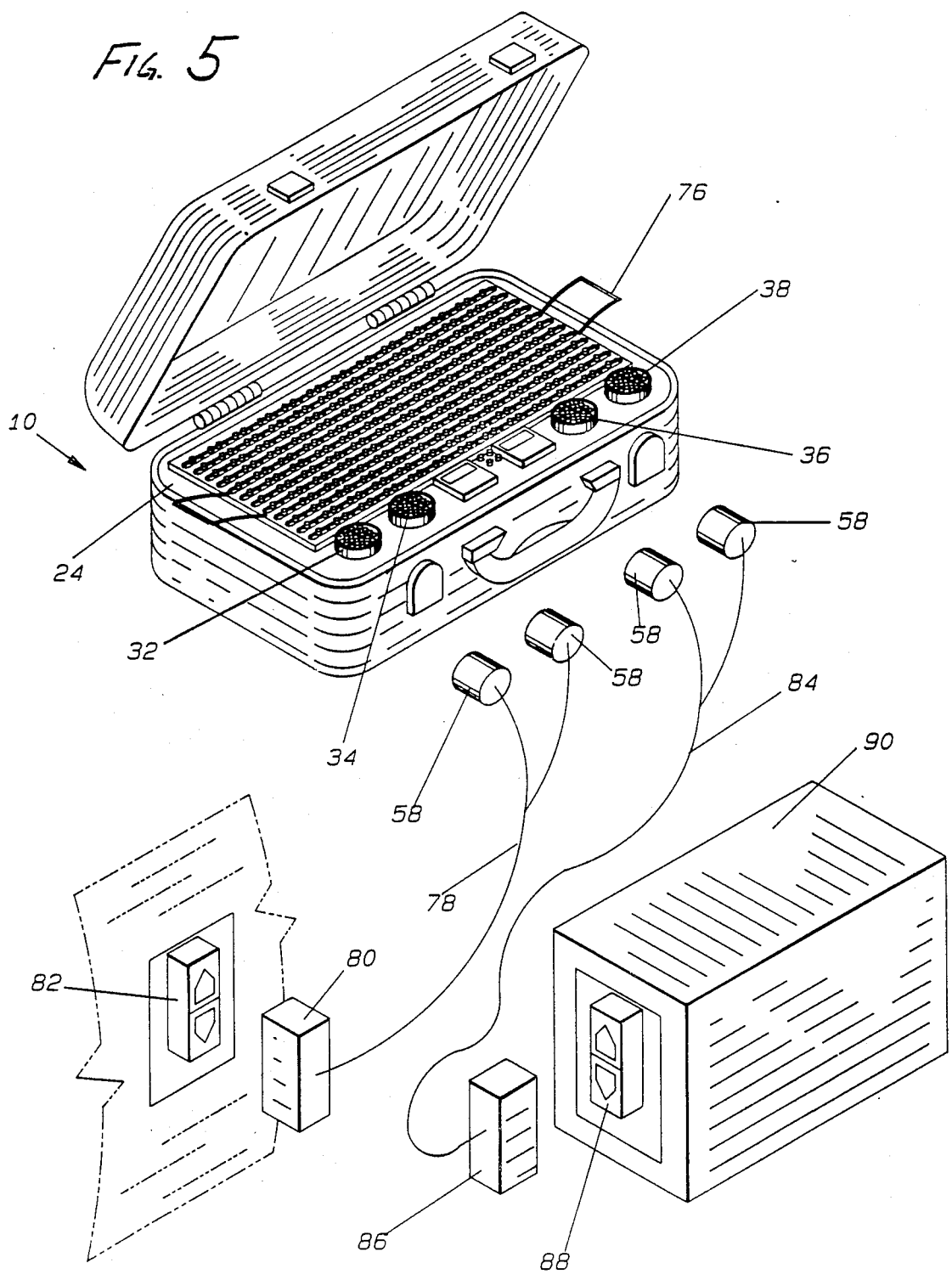

UNIVERSAL MASTER BREAKOUT UNIT FOR TESTING AVIONIC SYSTEMS

BACKGROUND OF THE INVENTION

1. Field of the Invention

The invention relates to the field of avionic test equipment and in particular to a breakout unit by means of which electronic systems on board an aircraft can be tested.

2. Description of the Prior Art

Avionic equipment aboard aircraft must be periodically tested for certification and in the course of maintenance be accessed for diagnostic testing. The number and complexity of onboard avionic systems, even on smaller aircraft continues to increase.

Typically, the manufacturers of an onboard avionic system will also build and provide a breakout unit which can be plugged into the avionic system and provide access to a number of contact points to which scopes, meters or other primary testing equipment can be appropriately connected to test signals and voltages at critical or test points in the system without the necessity of removing the system from the aircraft or attempting to locate, identify and access points within otherwise inaccessible circuit boards or sensors.

However, no two avionic systems placed on board are alike and there is no universal format or means of accessing such systems. Clearly, different points within an automatic pilot system as opposed to a telecommunications system or servo-control system will each have dramatically different circuits and different points which need to be accessed and tested for different signals.

Therefore, in order for service personnel to adequately test a wide range of aircraft, it is necessary that service personnel have a specific breakout unit for each system. The cost of the breakout unit is not inconsequential and the need for many different breakout systems, each adapted by design to a different avionic system or model of a given avionic system, aggregates to a substantial investment in test equipment and serves as a barrier to full service, competent avionic maintenance.

Therefore, what is needed is some type of apparatus and method which avoids these shortcomings of the prior and which allows avionic certification and maintenance personnel to fully service any kind of electronic system on any kind of an aircraft.

BRIEF SUMMARY OF THE INVENTION

The invention is an apparatus for providing access to and testing for a plurality of electronic circuits comprising a plurality of input jacks, and a plurality of output jacks. An input connector provides a plurality of electrical inputs. The electrical inputs of the input connector are correspondingly coupled to the plurality of input jacks. Each electrical input of the connector is connected to one of the plurality of input jacks. An output connector provides a plurality of electrical outputs. Each one of the electrical outputs is electrically coupled to one of the plurality of output jacks. A first circuit element selectively couples each one of the plurality of input jacks to a corresponding one of the plurality of output jacks. A template is disposable in proximity to the plurality of input and output jacks for designating specific significance of each associated pair of the input and output jacks.

As a result, electrical coupling between the plurality of input and output jacks, the input and output connectors, and the first and second element remain invariant as different types of the circuits are accessed and tested.

The apparatus further comprises an input harness for electrically coupling the input connector to a specified one of the circuits and an output harness for connecting the output connector to other specified points within the selected circuit. The input harness and output harness are specifically dedicated to the selected circuit.

The first circuit element is a plurality of manually operable switches. One of the plurality of switches is associated with each associated input and output jack. The switch selectively electrically couples the corresponding associated input and output jacks.

The apparatus further comprises a second circuit element for selectively providing access for testing an electrical signal being provided across a selected one of the plurality of input and output jacks.

The second circuit element comprises a plurality of meter circuits. Each meter circuit includes a plurality of input/output jacks, and patch cords. The input/output jacks are appropriately coupled by the patch cords to selected ones of the plurality of input jacks and output jacks.

The template comprises a plurality of templates. Each template designates a separate one of the plurality of circuits.

The apparatus further comprises a corresponding plurality of input harnesses and output harnesses. Each one of the plurality of templates has associated therewith a specific one of the input harnesses and one of the output harnesses. The one input harness and output harness are selectively designated for use with a selected one of the plurality of circuits.

The invention is also a method of testing a plurality of aircraft circuits having a plurality of test points with a single breakout apparatus comprising the steps of selecting one of the plurality of aircraft circuits for testing. A corresponding selected template is provided. The template corresponds to the selected aircraft circuit. The template specifically designates associated pairs of input and output jacks on the apparatus as corresponding to specific ones of the test signals within the aircraft circuit. The associated input and output jacks are coupled to corresponding input and output connectors within the apparatus. The connections between the plurality of input and output jacks, and the input and output connectors are independent of the step of selecting the aircraft circuit for testing. An input harness is provided for connecting the selected aircraft circuit to the single apparatus. The input harness corresponds to the selected aircraft circuit, and connects the selected aircraft circuit and the apparatus. An output harness is provided for connecting the single apparatus and the selected aircraft circuit. The output harness specifically corresponds to the selected aircraft circuit. The selected aircraft circuit is connected with the output connector of the single apparatus. Associated ones of the input and output jacks are selectively cross-coupled to complete electrical connection within the selected aircraft circuit through the single apparatus. Electrical signals provided across a selected one of the plurality of input and output jacks are selectively tested. The electrical signals are provided by the selected aircraft circuit through the input and output harnesses and through the input and output connectors to the corresponding input and output jacks.

As a result, any one of the plurality of aircraft circuits may be accessed and tested with the single apparatus regardless of differences between the aircraft circuits.

The invention can still further be characterized as a master breakout unit for testing a plurality of different types of aircraft circuits comprising a plurality of associated pairs of input and output jacks. An input connector is included and has a plurality of input connections. At least one connection of the connector is permanently coupled to one of the input jacks of the plurality of associated pairs of input and output jacks. An output connector is provided and has a plurality of connections. At least one connection of the output connector is permanently coupled to one output jack of each of the plurality of associated pairs of input and output jacks. A circuit element selectively couples ones of the input and output jacks. A plurality of templates is provided. Each template corresponds to one of the plurality of aircraft circuits. The template bears visible designations to label selected ones of the plurality of associated pairs of input and output jacks. Each template is disposed in proximity to the plurality of associated pairs of input and output jacks to allow visual correlation between the designation on the template and the pairs of jacks. A plurality of input and output harnesses is provided. Each input harness connects the input connector and a selected one of the plurality of aircraft circuits. Each output harness connects the output connector and a selected one of the plurality of aircraft circuits.

As a result, the plurality of distinct aircraft circuits may be accessed and tested through a single master breakout unit.

In the illustrated embodiment, the plurality of associated pairs of input and output jacks are disposed in a regular rectangular array and wherein each of the templates is a rectangular plate. The rectangular plate has a plurality of linear openings defined therethrough. The plate is arranged and configured to be disposed on top of the array of input and output jacks. The input and output jacks are disposed through and accessible through the linear slots. The designations of the template are disposed on the upper surface of the template to indicate by visual proximity to selected ones of the pairs of jacks a corresponding electrical signal provided to the pair of jacks from the corresponding aircraft circuit.

The invention and its various embodiments can better be visualized by turning to the following drawings wherein like elements are referenced by like numerals.

BRIEF DESCRIPTION OF THE DRAWINGS

FIG. 5 is a diagrammatic perspective view of the master breakout unit of FIG. 5 showing it as being used with a template and harnesses for connection to a avionic computer.

Figure 1:
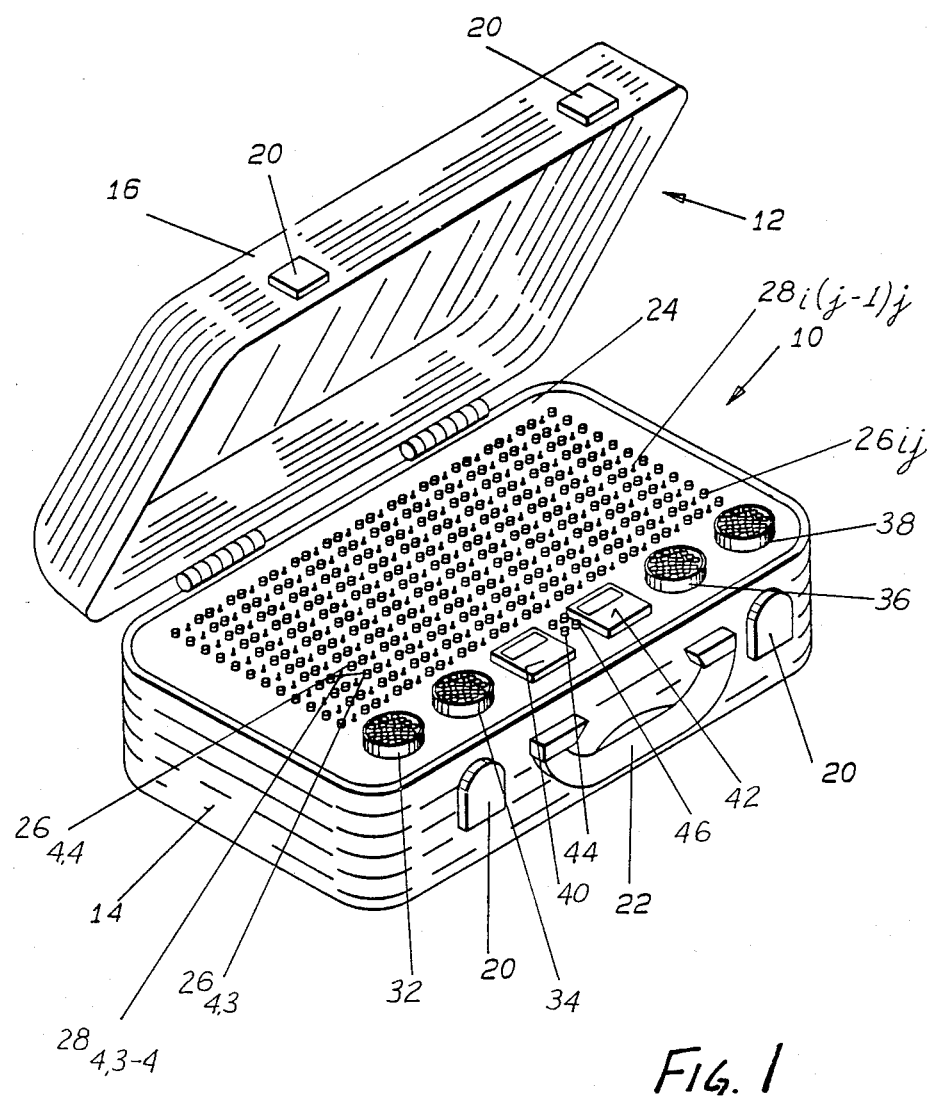
FIG. 1 is a perspective front view of a master breakout unit devised according to the invention.

These and other embodiments of the invention can be better understood by now turning to the following detailed description.

DETAILED DESCRIPTION OF THE PREFERRED EMBODIMENTS

A universal breakout unit is provided whereby aircraft circuits or systems may be accessed and tested regardless of the design differences between the various aircraft systems. The universal breakout unit comprises an array of associated pairs of input and output jacks which are disposed on a face panel of the breakout unit. Each input jack of each associated pair is uniformly wired to a connection with one or more input connectors. Similarly, each one of the output jacks of the associated pairs is wired to one connection within one or more output connectors. The input and output jacks are selectively coupled to each other through a manual toggle switch. A specially wired harness, corresponding to each specific aircraft circuit, is provided for connection to the input connector or output connector. A template which is designed to fit the face plate of the breakout unit and the array of associated pairs of jacks which corresponds to the selected harnesses and the selected aircraft circuit can then be place on the face plate of the master breakout unit. Labels on the template designate what signal or test point will then appear across the proximate pair of jacks. The signal may be tested through the use of patch cords coupling meters which may be included within the master breakout unit or may be coupled to meters or other test devices separate from the breakout unit.

In the illustrated embodiment, a master breakout unit, generally denoted by reference numeral 10, is housed within a sturdy aluminum case 12 which is fabricated in the form of a small suitcase or attache case having bottom 14 into which the body of the master breakout unit is disposed and a lid 16. Bottom 14 and lid 16 are rotatably coupled together by means of a pair of hinges 18 with the upper lid closable and lockable on bottom 14 by means of conventional latches 20. The whole unit is then conveniently transported by means of a handle 22 and weights approximately 10 pounds.

Master breakout unit 10 is comprised of a main chassis board 24 in which a plurality of electrical connectors $26_{ij}$ are disposed. In the illustrated embodiment each connector $26_{ij}$ is a plug-in jack or banana-plug connector which is designed to accept temporary electrical connection to a conventional appropriate male connecting pin. Each female connector $26_{ij}$ is referenced with two subscripts, the first subscript denoting the horizontal row in which the connector lies as depicted in FIG. 1 with the second subscript denoting the vertical column in which the connector lies.

Each connector $26_{ij}$ is associated with an identical corresponding connector within the same row and in an adjacent column. For example, connector $26_{43}$ is associated with connector $26_{44}$. In between each associated pair of connectors $26_{ij}$ is an electrical switch $28_{i,(j-1)j}$. For example, between connectors $26_{43}$ and $26_{44}$ is an electrical switch $28_{4,3-4}$ which can be manually activated to selectively electrically connect conductors $26_{43}$ and $26_{44}$. Mounted within and along the base of panel 24 as depicted in FIG. 1 shows a plurality of panel cable connectors 32-38. In the illustrated embodiment connectors 32, 34, 36 and 38 are female multiple-pin connectors with different keyway configurations. In the illustrated embodiment, for example, panel cable connector 32 is a M$3102A40-56$ type female connector; panel cable connector 34 is a M$3102A40-56$W type female connector; panel cable connector 36 is a M$3102A40-56$X type female connector; and panel cable connector 38 is a M$3102A40-56$X type female connector. A plurality of multiple pin connectors are used in the illustrated embodiment because the number of connections needed cannot practically be accommodated in a conventional connector. Therefore, a plurality of conventional connectors are used. In the event that a single connector can accommodate all the needed connections, a plurality of connectors as illustrated here would of course not be needed.

Connectors 32 and 34 provide input connections for input harnesses while connectors 36 and 38 provide corresponding connections for output harnesses.

Each of connectors 32-38 is appropriately electrically connected vis-a-vis soldered, insulated wires running between connectors 32-38 to appropriate ones of connection sockets $26_{ij}$. The wires are not illustrated in the Figures but are disposed between connectors 32-38 and input jacks $26_{ij}$ underneath panel 24 in a conventional manner.

Of each associated pair of connectors $26_{ij}$, one connector will correspond and be coupled to an appropriate one of the input connectors 32 or 34, while the associated one will correspond and be connected to the appropriate one of output connectors 36 or 38. For example, input jack $26_{43}$ could be electrically coupled to an appropriate pin within input connector 32, while jack $26_{44}$ is appropriately connected to a selected pin within corresponding output connector 36.

Breakout unit 10 may also have one or more test meters incorporated therein. For example, in the illustrated embodiment, breakout unit 10 includes an A/C ampmeter 40 and a D/C ampmeter 42. The inputs to meter 40 are provided through panel 24 by means of jacks 44 while inputs to D/C meter 42 are similarly provided through jacks 46. Therefore, through the use of appropriate lengths of patch cord, meters 40 and 42 can be arbitrarily coupled across any associated pair of jacks $26_{ij}$ within breakout unit 10.

Therefore, when the harness, as described in connection with FIGS. 2-5, is appropriately connected to input connectors 32 or 34 and to output connectors 36 or 38, the selected cross-coupled pins within the harnesses are connected together by appropriately activating selected ones of the toggle switches 28. Ampmeters 40 and 42 can then be patched across selected pins between the input and out connectors to determine the amount of current flowing across the selected pins. Similarly, additional test equipment such as oscilloscopes, voltmeters, ohmmeters and the like which are not included as part of master breakout unit 10 can be similarly patched across selected connectors $26_{ij}$.

Figure 2:
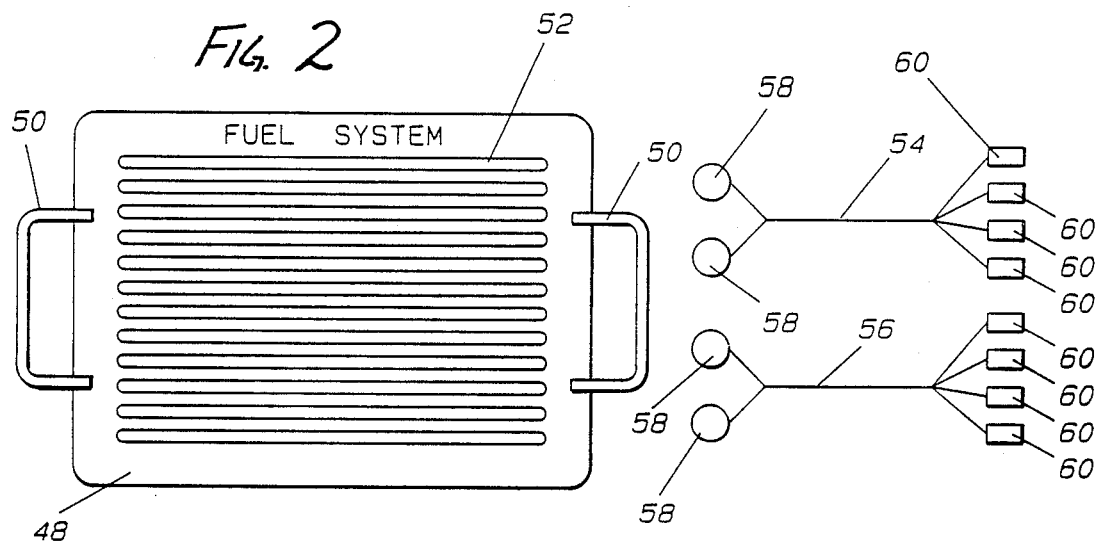
FIG. 2 is a simplified plan view of a pair of harnesses and a template for use in combination with the master breakout unit of FIG. 1, which can be utilized, for example, with the fuel system of an aircraft.
Figure 3:
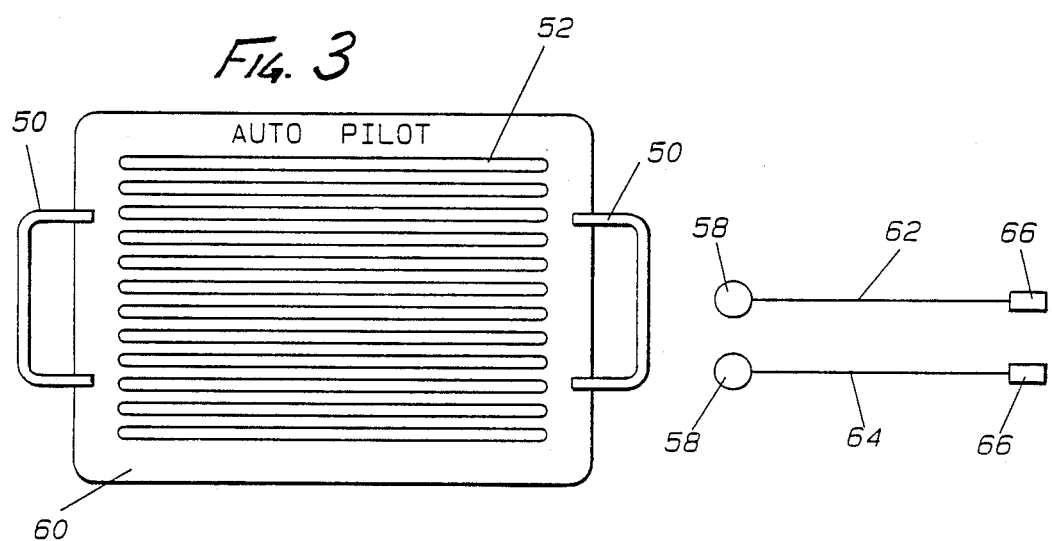
FIG. 3 is a plan view of a pair of harnesses and a template which may be utilized in the manner described in connection with FIG. 2, but with an auto-pilot system instead.
Figure 4:
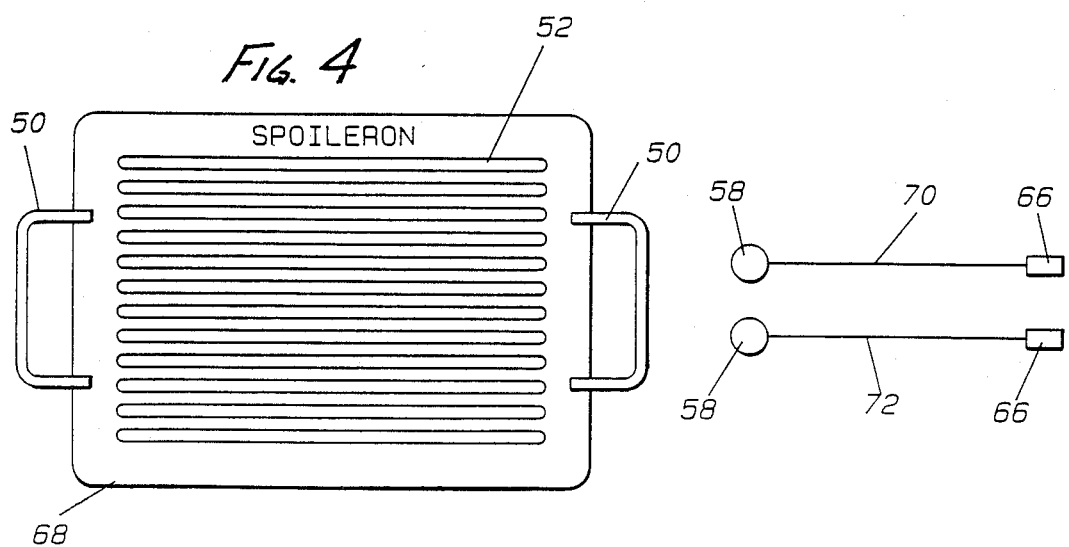
FIG. 4 is a plan view of a pair of harnesses and a template of the type generally described in connection with FIGS. 2 and 3, but which is utilized instead with a spoileron system.

Turn now to FIGS. 2-4 wherein plan elevational views of templates and input and output harnesses utilized with master breakout unit 10 of the invention are employed. For example, in FIG. 2 a template plate 48 having opposable side handles 50 and a plurality of open horizontal slots 52 defined therethrough is provided for ascribing a particular significance to the underlying jack $26_{ij}$. For example, in the embodiment of FIG. 2, template plate 48 would have the appropriate test connection designations printed on its upper surface for a fuel system for a particular type of aircraft. Associated with template 48 would be a specific input harness, generally denoted by reference numeral 54 and an output harness, generally denoted by reference numeral 56. One end of each harness 54 and 56 would be provided with multiple-pin connectors 58 having a design and type suitable for connection with connectors 32-38 of breakout unit 10. The opposing end of each harness 54 and 56 would then be provided with a plurality of separate connectors 60 which would be connected to the appropriate input/output jacks of the aircraft system in question, as illustrated in greater detail in the embodiment of FIG. 5.

The illustration of FIG. 2 represents, for example, a template and harnesses which would be used for the fuel system in a Learjet with connectors 60 appropriate in number and type for connection to various points within the Learjet fuel system. Template 48 is placed on top of base plate 24 in a manner as depicted in FIG. 5. The user can then read the template in a manner consistent with a particular wiring scheme implemented within harnesses 54 and 56. In other words, certain ones of connectors 60, which connect to the Learjet fuel system, will be connected to specified wires within harnesses 54 and 56 and thus specified pins within connectors 58 on one hand and connectors 32-38 on the other. Template 48, when placed upon base plate 24 would then provide the appropriate association between selected jacks $26_{ij}$ and the corresponding and appropriate connector 60.

Similarly, in the embodiment of FIG. 3 a second template 60 is provided which is identical to template 48 of FIG. 2 with the exception that test point designations which are printed onto the upper surface of template 60 correspond to the autopilot system of a Learjet, or other aircraft, and are to be used in connection with appropriately wired input harness 62 and output harness 64. Harnesses 62 and 64 have the same type of connectors 58 for coupling appropriately to selected ones of panel connectors 32-38. The harnesses are wired according to the aircraft's autopilot schematic to appropriate pins in connectors 66 which are of a type and configuration suitable for direct connection to appropriate ports in the autopilot system of the aircraft.

Once again, in the embodiment of FIG. 3 a third template 68 again is identical to templates 48 and 60 with the exception that the test point designation printed on the upper surface of test plate 68 refer to various test points or parameters in a spoileron system for the aircraft. Test plate 68 is again utilized with specifically wired harnesses 70 and 72 appropriate for the spoileron system. Harnesses 70 and 72 again are terminated with connectors 58 at one end and with connectors 74 at the opposing end, which are of a design and type suitable for the aircraft spoileron system.

It can now be understood when reviewing the configurations of FIGS. 2-4 that various types of avionic systems can be accessed and tested, while utilizing a master breakout unit 10 which is uniformly wired and unaltered. No wiring within breakout box 10 is changed when breakout box 10 is utilized to check the fuel system of the aircraft using template 48, as opposed to when it is used to check the autopilot system using autopilot template 60 or the spoileron system using template 68. In addition, the same three systems in different aircraft may be tested utilizing templates and corresponding harnesses different than those shown in FIGS. 2-4 with the same master breakout unit. Master breakout unit 10 is therefore universal and any wiring idiosyncrasies or specifics are accommodated by the appropriate wiring within the input and output harnesses in association with the interchangeable designations provided by the corresponding templates.

FIG. 5 is a diagrammatic perspective view of the invention utilized to test a Sperry airdata computer. Again the universal master breakout box 10 is carried onto the aircraft by the technician with an appropriate template 76 for the model of airdata computer which is to be checked. Template 76 is then placed as shown on base plate 24 thereby providing a map designation for the technician to identify the various test points and pins relating to the airdata computer. A corresponding and specially wired input harness 78 with its terminating connectors 58 are then connected to panel connectors 32 and 34 as appropriate at one end and connected at the opposing end of harness 78 through connector 80 to the data input and output port 82 associated, for example, with the pilot's control panel. Output harness 84, also provided with connectors 58 for connection to output connectors 36 and 38 is also connected at its opposing end to a termination 86, particularly adapted in design for connection to the input-output or other operative terminal 88 of airdata computer 90.

The technician is now at liberty to access and test each and every line on the bus connecting the computer with the control console in the aircraft. Neither the interior of the console nor of the computer need be accessed or actually opened to permit this. Which line is being accessed is displayed to the technician by the appropriate designation on the upper face of template 76 according to the wiring incorporated in harnesses 78 and 84.

It now may be readily appreciated that simply by changing templates and harnesses the technician may continue to test and cerify the autopilot system, the fuel system, the spoileron system and other systems within the aircraft even though each system is made by a different manufacturer and has a radiacally different circuit architecture.

It must be understood that the illustrated embodiment has been set forth only for the purposes of example and should not be taken as limiting the invention which is defined in the following claims. Many modifications may be made by those having ordinary skill in the art without departing from the spirit and scope of the invention.

I claim:

1. A portable apparatus for providing access and testing to a plurality of electronic circuits comprising:
    a hand-carried case;
    a plurality of input jacks mounted in fixed positions within said case in a first array;
    a plurality of output jacks mounted in fixed positions within said case in a second array;
    an input connector mounted in said case for providing a plurality of electrical inputs, said electrical inputs of said input connector correspondingly coupled to said plurality of input jacks, each electrical input of said input connector being connected to one of said plurality of input jacks;
    an output connector mounted in said case for providing a plurality of electrical outputs, each one of said electrical outputs being electrically coupled to one of said plurality of output jacks;
    first means for selectively coupling each one of said plurality of input jacks in said first array to a corresponding one of said plurality of output jacks in said second array; and
    template means disposable on said first array and second array of said plurality of input and output jacks for designating specific significance of each associated pair of said input and output jacks,
    whereby electrical coupling between said pluraliy of input and output jacks, and between said input and output connectors, remain invariant as different types of said circuits are accessed and tested.

2. The apparatus of claim 1 further comprising an input harness means for electrically coupling said input connector to a specified one of said circuits and an output harness means for connecting said output connector to other specified points within said selected circuit, said input harness means and output harness means being specifically dedicated to said selected circuit.

3. The apparatus of claim 1 wherein said template means comprises a plurality of templates, each template for designating a separate one of said plurality of circuits.

4. The apparatus of claim 3 further comprising a corresponding plurality of input harnesses and output harnesses, each one of said plurality of templates having associated therewith a specific one of said input harnesses and one of said output harnesses, said one input harness and output harness being selectively designated for use with a selected one of said plurality of circuits.

5. A method of testing a plurality of aircraft circuits having a plurality of test points with a single portable breakout apparatus comprising the steps of:
    selecting one of said plurality of aircraft circuits for testing;
    providing a portable case for containing a plurality of input and output jacks in a fixed array;
    providing a corresponding selected template, said template corresponding to said selected aircraft circuit, said template specifically designating associated pairs of input and output jacks on said apparatus as corresponding to specific ones of said test signals within said aircraft circuit when said template is disposed on said array of input and output jacks, said associated input and output jacks being coupled to corresponding input and output connectors within said apparatus, the connections between said plurality of input and output jacks, and said input and output connectors being fixed and invariant
    disposing said template on said array of input and output jacks;
    providing an input harness for connecting said selected aircraft circuit to said single apparatus, said input harness corresponding to said selected aircraft circuit;
    connecting said selected aircraft circuit and said apparatus by use of said input harness;
    providing an output harness for connecting said single apparatus and said selected aircraft circuit, said output harness specifically corresponding to said selected aircraft circuit;
    connecting said selected circuit with said output connector of said single apparatus by use of said output harness;
    selectively cross-coupling associated ones of said input and output jacks to complete electrical connection within said selected aircraft circuit through said single portable apparatus; and selectively testing electrical signals provided across a selected one of said plurality of input and output jacks, said electrical signals being provided by said selected aircraft circuit through said input and output harnesses and input and output connectors to said corresponding input and output jacks, whereby any one of said plurality of aircraft circuits may be accessed and tested with said single apparatus regardless of differences between said aircraft circuits.

6. A portable master breakout unit for testing a plurality of different types of aircraft circuits comprising:

a portable hand-carried case;

a plurality of associated pairs of input and output jacks disposed in a fixed array in said portable case;

an input connector having a plurality of input connections, at least one connection of said connector being permanently coupled to one of said input jacks of said plurality of associated pairs of input and output jacks;

an output connector having a plurality of connections, at least one connection of said output connector being permanently coupled to one output jack of each of said plurality of associated pairs of input and output jacks;

means for selectively coupling ones of said input and output jacks together;

a plurality of templates, each template corresponding to one of said plurality of aircraft circuits, said template bearing visible designations thereon to label selected ones of said plurality of associated pairs of input and output jacks when said template is disposed on said array, each template disposable on said array of said plurality of associated pairs of input and output jacks to allow visual correlation between said designation on said template and said pairs of jacks; and a plurality of input and output harnesses, each input harness for connecting between said input connector and a selected one of said plurality of aircraft circuits and each output harness for connecting between said output connector and a selected one of said plurality of aircraft circuits, whereby said plurality of distinct aircraft circuits may be accessed and tested through a single portable master breakout unit.

7. A master breakout unit for testing a plurality of different types of aircraft circuits comprising:

a plurality of associated pairs of input and output jacks;

an input connector having a plurality of input connections, at least one connection of said connector being permanently coupled to one of said input jacks of said plurality of associated pairs of input and output jacks;

an output connector having a plurality of connections, at least one connection of said output connector being permanently coupled to one output jack of each of said plurality of associated pairs of input and output jacks;

means for selectively coupling ones of said input and output jacks together;

a plurality of templates, each template corresponding to one of said plurality of aircraft circuits, said template bearing visible designations thereon to label selected ones of said plurality of associated pairs of input and output jacks, each template disposable in proximity to said plurality of associated pairs of input and output jacks to allow visual correlation between said designation on said template and said pairs of jacks; and a plurality of input and output harnesses, each input harness for connecting between said input connector and a selected one of said plurality of aircraft circuits and each output harness for connecting between said output connector and a selected one of said plurality of aircraft circuits, wherein said plurality of associated pairs of input and output jacks are disposed in a regular rectangular array and wherein each of said templates is a rectangular plate, said rectangular plate having a plurality of linear openings defined therethrough, said plate arranged and configured to be disposed on top of said array of input and output jacks, said input and output jacks being disposed through and accessible through said linear slots, said designations of said template being disposed on the upper surface of said template to indicate by visual proximity to selected ones of said pairs of jacks a corresponding electrical signal provided to said pair of jacks from said corresponding aircraft circuit, whereby said plurality of distinct aircraft circuits may be accessed and tested through a single master breakout unit.

8. A master breakout unit for testing a plurality of different types of aircraft circuits comprising:

a plurality of associated pairs of input and output jacks;

an input connector having a plurality of input connections, at least one connection of said connector being permanently coupled to one of said input jacks of said plurality of associated pairs of input and output jacks;

an output connector having a plurality of connections, at least one connection of said output connector being permanently coupled to one output jack of each of said plurality of associated pairs of input and output jacks;

means for selectively coupling ones of said input and output jacks together;

a plurality of templates, each template corresponding to one of said plurality of aircraft circuits, said template bearing visible designations thereon to label selected ones of said plurality of associated pairs of input and output jacks, each template disposable in proximity to said plurality of associated paris of input and output jacks to allow visual correlation between said designation on said template and said pairs of jacks;

a plurality of input and output harnesses, each input harness for connecting between said input connector and a selected one of said plurality of aircraft circuits and each output harness for connecting between said output connector and a selected one of said plurality of aircraft circuits; and a plurality of meter circuits, each meter circuit for temporary connection to selected ones of said associated pairs of input and out jacks for testing electrical signals provided from said selected aircraft circuit to said selected one of said associated pair of jacks;

wherein said plurality of associated pairs of input and output jacks are disposed in a regular rectangular array and wherein each of said templates is a rectangular plate, said rettangular plate having a plurality of linear openings defined therethrough, said plate arranged and configured to be disposed on top of said array of input and output jacks, said input and output jacks being disposed through and accessible through said linear slots, said designations of said template being disposed on the upper surface of said template to indicate by visual proximity to selected ones of said pairs of jacks a corresponding electrical signal provided to said pair of jacks from said corresponding aircraft circuit, whereby said plurality of distinct aircraft circuits may be accessed and tested through a single master breakout unit.

9. A master breakout unit for testing a plurality of different types of aircraft circuits comprising:

a plurality of associated pairs of input and output jacks;

an input connector having a plurality of input connections, at least one connection of said connector being permanently coupled to one of said input jacks of said plurality of associated pairs of input and output jacks;

an output connector having a plurality of connections, at least one connection of said output connector being permanently coupled to one output jack of each of said plurality of associated pairs of input and output jacks;

means for selectively coupling ones of said input and output jacks together;

a plurality of templates, each template corresponding to one of said plurality of aircraft circuits, said template bearing visible designations thereon to label selected ones of said plurality of associated pairs of input and output jacks, each template disposable in proximity to said plurality of associated pairs of input and output jacks to allow visual correlation between said designation on said template and said pairs of jacks; and a plurality of input and output harnesses, each input harness for connecting between said input connector and a selected one of said plurality of aircraft circuits and each output harness for connecting between said output connector and a selected one of said plurality of aircraft circuits;

wherein said plurality of associated pairs of input and output jacks are disposed in a regular rectangular array and wherein each of said templates is a rectangular plate, said rectangular plate having a plurality of linear openings defined therethrough, said plate arranged and configured to be disposed on top of said array of input and output jacks, said input and output jacks being disposed through and accessible through said linear slots, said designations of said template being disposed on the upper surface of said template to indicate by visual proximity to selected ones of said pairs of jacks a corresponding electrical signal provided to said pair of jacks from said corresponding aircraft circuit, whereby said plurality of distinct aircraft circuits may be accessed and tested through a single master breakout unit.

* * * * *